United States Patent
Skotnicki et al.

(10) Patent No.: US 6,746,923 B2
(45) Date of Patent: Jun. 8, 2004

(54) METHOD OF FABRICATING A VERTICAL QUADRUPLE CONDUCTION CHANNEL INSULATED GATE TRANSISTOR

(75) Inventors: Thomas Skotnicki, Crolles Montfort (FR); Emmanuel Josse, La Motte Servolex (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/114,672

(22) Filed: Apr. 2, 2002

(65) Prior Publication Data

US 2002/0163027 A1 Nov. 7, 2002

(30) Foreign Application Priority Data

Apr. 2, 2001 (FR) ................................. 01 04437

(51) Int. Cl.[7] .................................. H01L 21/336
(52) U.S. Cl. ................ 438/270; 438/430; 438/259
(58) Field of Search ................. 257/329, 330–334, 257/302, 623; 438/259–260, 267, 269, 270, 361, 429, 430, 164, 242, 412

(56) References Cited

U.S. PATENT DOCUMENTS

| | | | |
|---|---|---|---|
| 5,656,842 A | 8/1997 | Iwamatsu et al. | |
| 5,965,914 A | 10/1999 | Miyamoto | |
| 6,020,239 A | 2/2000 | Gambino et al. | |
| 6,312,992 B1 | * 11/2001 | Cho | ............... 438/268 |
| 6,440,801 B1 | * 8/2002 | Furukawa et al. | ........... 438/272 |
| 6,528,405 B1 | * 3/2003 | Martinez et al. | ............. 438/602 |
| 6,587,396 B1 | * 7/2003 | Jang | ........................... 438/259 |

FOREIGN PATENT DOCUMENTS

| JP | 04264776 | 9/1992 |
|---|---|---|
| JP | 04294585 | 10/1992 |

OTHER PUBLICATIONS

French Preliminary Search Report dated Feb. 6, 2002 for French Application No. 0104437.

* cited by examiner

*Primary Examiner*—Tom Thomas
*Assistant Examiner*—José R. Diaz
(74) *Attorney, Agent, or Firm*—Lisa K. Jorgenson; Jon A. Gibbons; Fleit, Kain, Gibbons, Gutman, Bongini & Bianco P.L.

(57) ABSTRACT

The vertical insulated gate transistor includes, on a semiconductor substrate, a vertical pillar incorporating one of the source and drain regions at the top, a gate dielectric layer situated on the flanks of the pillar and on the top surface of the substrate, and a semiconductor gate resting on the gate dielectric layer. The other of the source and drain regions is in the bottom part of the pillar PIL and the insulated gate includes an isolated external portion 15 resting on the flanks of the pillar and an isolated internal portion 14 situated inside the pillar between the source and drain regions. The isolated internal portion is separated laterally from the isolated external portion by two connecting semiconductor regions PL1, PL2 extending between the source and drain regions, and forming two very fine pillars.

29 Claims, 9 Drawing Sheets

METHOD OF FABRICATING A VERTICAL QUADRUPLE CONDUCTION CHANNEL INSULATED GATE TRANSISTOR

CROSS REFERENCE TO RELATED APPLICATIONS

This application is based upon and claims priority from prior French Patent Application No. 0104437, filed Apr. 2, 2001, the disclosure of which is hereby incorporated by reference in its entirety.

BACKGROUND OF THE INVENTION

1. Field of the Invention

The present invention generally relates to the field of integrated circuits and more particularly to vertical insulated gate transistors.

The invention applies in particular, although not exclusively, to high-speed logic circuits and radio-frequency circuits. More generally, the invention finds an application in technologies below 0.07 micron.

2. Description of Related Art

The vertical transistor is a device that overcomes the limitations of the planar MOS transistor, in lengths less than 0.1 micron. Its conduction body consists of a silicon pillar insulated and covered by a gate. It therefore has at least two conduction interfaces. Accordingly, the current $I_{on}$ and the transconductance per unit width are interfaces. Accordingly, the current $I_{on}$ and the transconductance per unit width are at least doubled. For sufficiently fine silicon pillars, with a dimension of the order of 50 nm, coupling between the gates is observed, reducing the effects of the short channels. This makes it possible to reduce the doping of the pillar, which is particularly favorable from the point of view of the current $I_{on}$. Also, conduction over a plurality of interfaces, in conjunction with the coupling of the gates, makes it possible to eliminate the need to form ultrafine gate oxides or high-permittivity dielectrics.

What is more, the vertical transistor is a technological platform particularly suitable for implementing a coating gate architecture with ultrashort dimensions. This is because the channel length in the vertical transistor is not fixed by the photolithographic resolution. It is therefore possible to form channels with very small dimensions using standard photolithographic equipment. Also, coating a projecting silicon pillar with a gate is much simpler than coating a thin silicon film buried in a substrate.

The person skilled in the art knows of many methods of fabricating a vertical insulated gate transistor, using different techniques to form the silicon pillar. In a first approach, the silicon pillar is etched anisotropically from a silicon layer grown epitaxially from the isolated substrate.

In a second, more sophisticated approach, the pillar is grown epitaxially, overflowing into an open window in a dielectric layer.

The first approach draws its inspiration largely from steps of the conventional method of producing a planar transistor. In particular, forming the pillar by etching resembles etching the gate of a planar transistor. The pillar is doped after it is formed, although it could be doped during epitaxial growth or before etching. The source and drain regions are implanted in a self-aligned manner relative to the pillar. The source can also be implanted before epitaxial growth, in which case it is referred to as "continuous" (the source areas on either side of the pillar are joined together). The gate oxide is then formed on the flanks of the silicon pillar. The polysilicon gate is then deposited, doped and then etched.

This kind of approach, which is simple to implement, makes it possible to develop a CMOS line based on vertical transistors at reduced cost.

With the second approach, the epitaxially grown pillar is planarized by mechanical/chemical polishing. The benefit of the second approach is that it leaves at the base of the pillar a thick dielectric reducing the capacitance of the overlap on the source.

Although these two approaches are useful, they are not without their shortcomings. One shortcoming with these two approaches is that the thickness of the silicon pillar depends on the resolution of the photolithographic method used either to etch the pillar directly or to open the window in the dielectric layer. Thus at present there is no hope of producing very thin pillars (i.e. thinner than 50 nm) with conventional photolithography, which consequently limits the effectiveness of the gate coupling phenomenon.

Another shortcoming with these two approaches is that in a vertical transistor, the depth of the junctions is equal to the thickness of the silicon pillar. For a relatively thick pillar, the junction depth can therefore be very large compared to the length of the channel, which is extremely unfavorable in terms of controlling the effects of short channels.

Accordingly, a need exist to overcome these shortcomings.

SUMMARY OF THE INVENTION

The present invention decorrelates the thickness of the pillar of the vertical transistor from the photolithographic resolution, i.e. to define the thickness of the channel independently of the photolithographic resolution.

Moreover, the present invention provides a vertical transistor with four conduction channels.

Furthermore, the present invention is to reduce the depth of the source and drain extension areas independently of the depth of the junctions.

Accordingly, in one embodiment, a silicon-germanium alloy layer is interleaved into the stack of the pillar, further silicon is grown epitaxially around the pillar, and the core of the pillar, which is of silicon-germanium alloy, is then emptied out by etching which is selective with respect to the silicon and to an oxide layer. This produces two very thin "connecting" semiconductor areas that can be isolated and coated with a gate. The source and drain regions can be diffused into these very thin semiconductor areas, which forms very shallow extension areas. The final device then has four conduction channels operating over these two connecting semiconductor areas, which are entirely impoverished.

It should also be noted that the invention applies regardless of the approach adopted to forming the pillar, i.e. anisotropic etching or epitaxial growth in an open window in a dielectric block.

More generally, the invention proposes a method of fabricating a vertical insulated gate transistor, including forming a vertical semiconductor pillar on a semiconductor substrate and forming a dielectrically isolated semiconductor gate resting on the flanks of the pillar and on the top surface of the substrate.

Furthermore, forming the pillar includes forming a primary semiconductor pillar resting on the substrate and forming a cavity in the primary pillar, and in that forming the insulated gate further includes coating the internal walls of the cavity with an isolating dielectric material and filling the cavity thus isolated with the gate material, to form between the portion of the insulated gate situated in the cavity and the portion of the insulated gate resting on the flanks of the pillar two connecting semiconductor regions extending between the source and drain regions of the transistor. As previously indicated, these two connecting semiconductor regions will support the four conduction channels.

In one embodiment of the invention forming the primary pillar includes:

forming a stack including a first layer of a first semiconductor material, for example silicon, a second layer of a second semiconductor material, for example a silicon-germanium alloy (possibly a silicon-germanium-carbon alloy), that can be selectively eliminated with respect to the first material, and a third layer of the first material, and forming on the stack a surface semiconductor layer of the first material (it is this surface layer that will define the thickness of the connecting semiconductor regions), and the second layer of the stack is etched selectively to form said cavity. As indicated above, the invention is compatible with producing the pillar by anisotropic etching or by epitaxial growth in a dielectric window.

More particularly, with this latter approach, the stack is formed by selective epitaxial growth inside a window formed in a dielectric block resting on the top surface of the substrate, said window opening onto the top surface of the substrate. Forming the surface semiconductor layer includes removing the dielectric block and selective epitaxial growth of said surface layer on said stack.

In a different embodiment of the invention forming the stack of the primary pillar includes epitaxial growth of said three layers on the top surface of the substrate followed by anisotropic etching of the epitaxially grown layers. Forming the surface semiconductor layer then includes selective epitaxial growth of said surface layer on said stack thus formed.

In one embodiment of the invention forming the insulated gate includes forming an external isolating layer on the primary pillar and an internal isolating layer on the internal walls of the cavity, depositing a gate material on the external isolating layer and in the coated cavity of the internal isolating layer, and anisotropically etching the gate material.

The thickness of the surface layer can be of the order of a few tens of nanometers, for example 20 nanometers.

The method advantageously includes annealing to activate dopants of the source and drain regions leading by exodiffusion to the formation of source and drain extension areas in a portion of the semiconductor connecting regions.

The invention also provides an integrated circuit including an insulated gate vertical transistor including, on a semiconductor substrate, a vertical pillar incorporating one of the source and drain regions at the top, a gate dielectric layer situated on the flanks of the pillar and on the top surface of the substrate, and a semiconductor gate resting on the gate dielectric layer.

According to one general feature of the invention the other of the source and drain regions is in the bottom part of the pillar and the insulated gate includes an isolated external portion resting on the flanks of the pillar and an isolated internal portion situated inside the pillar between the source and drain regions. The isolated internal portion is separated laterally from the isolated external portion by two connecting semiconductor regions extending between the source and drain regions. The thickness of each semiconductor region can be of the order of a few tens of nanometers, for example 20 nanometers.

In one embodiment of the invention each connecting semiconductor region incorporates source and drain extension areas.

BRIEF DESCRIPTION OF THE DRAWINGS

The subject matter which is regarded as the invention is particularly pointed out and distinctly claimed in the claims at the conclusion of the specification. The foregoing and other features, and advantages of the invention will be apparent from the following detailed description taken in conjunction with the accompanying drawings.

DETAILED DESCRIPTION OF AN EMBODIMENT

Figure 1:
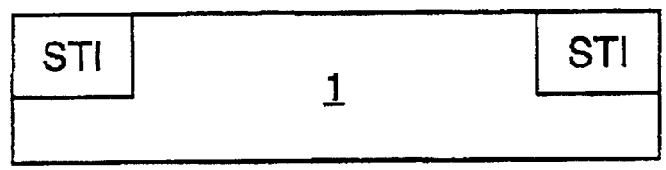
FIGS. 1 to 21 show the principal steps of one embodiment of the method according to the invention, yielding one embodiment of a transistor according to the invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In the drawing like numerals refer to like parts through several views.

FIG. 1 shows a semiconductor, for example silicon, substrate 1 including lateral isolation areas STI using the shallow trench isolation technique. The lateral isolation areas STI delimit an active substrate area in and on which the future vertical transistor will be formed.

At this stage of the process, insulating wells are also implanted in the substrate 1. They are not shown in FIG. 1, for simplicity.

Figure 2:
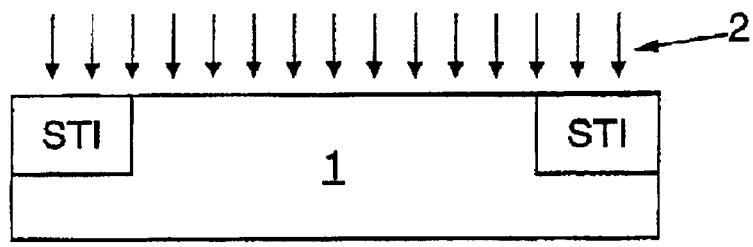

The substrate 1 is then implanted 2 (FIG. 2) with a high dose of the type of dopant required for the source. This implantation 2 forms the portion of the source that will be situated in the substrate and is conventionally followed by annealing.

Figure 3:
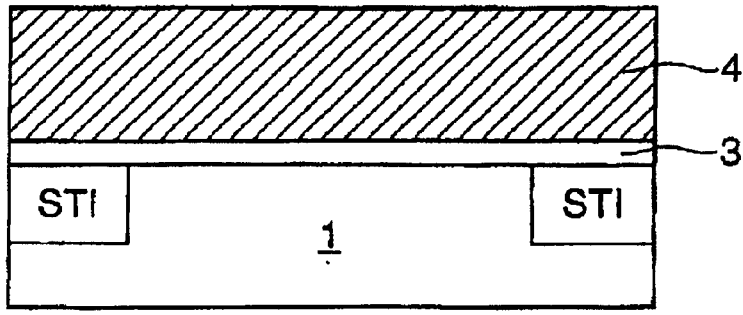

A dielectric block formed of a layer 3 of oxide, for example of silicon dioxide, and a silicon nitride layer 4 is then deposited (FIG. 3).

Figure 4:
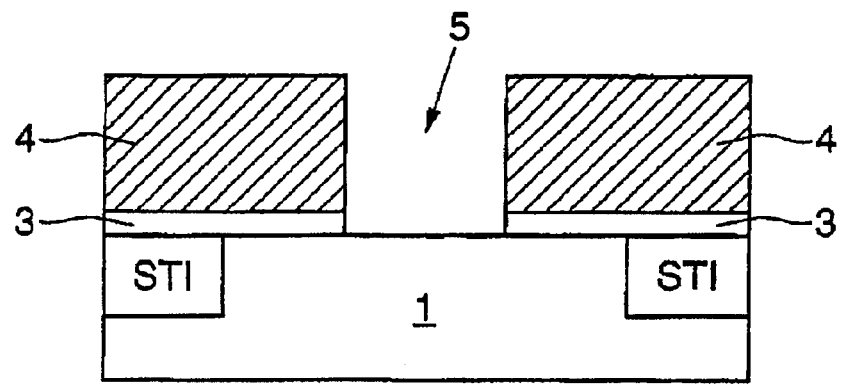

The dielectric block formed of the dual layer 3 and 4 is then opened by anisotropic etching, stopping at the substrate 1 (FIG. 4), to form in the dielectric block a window 5 opening onto the top surface of the substrate.

Figure 5:
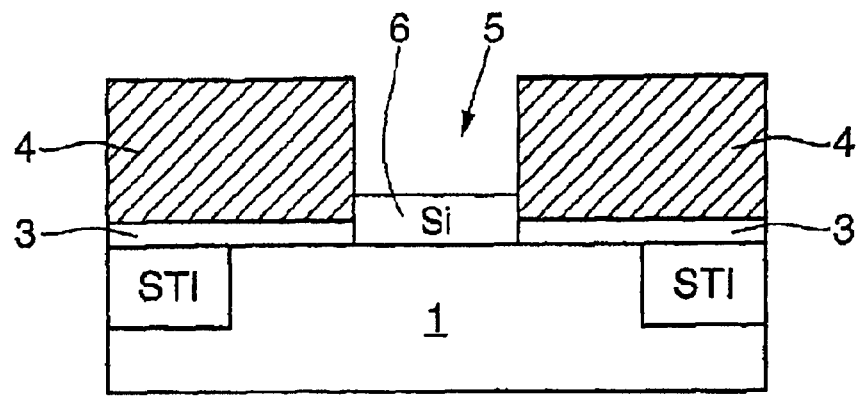

A first silicon layer 6 is then formed in the window 5 by selective epitaxial growth (FIG. 5).

Figure 6:
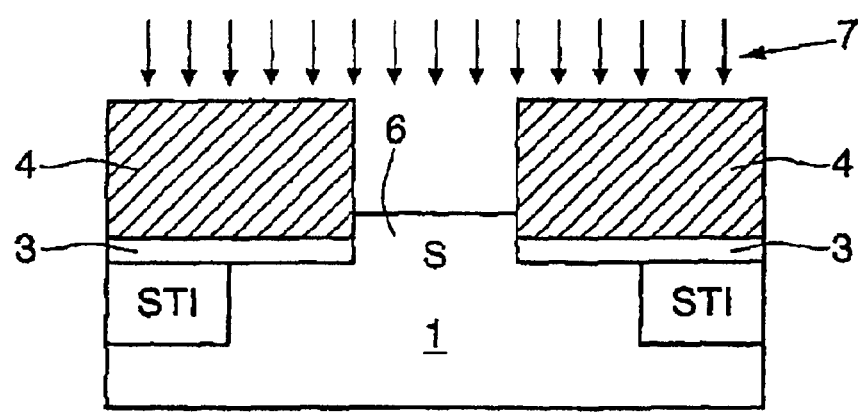

Then, as shown in FIG. 6, implantation 7 with a high dose through the window 5 dopes the layer 6 that will form the portion of the source S in the bottom part of the future pillar of the vertical transistor. As before, the implantation 7 is followed by annealing in the conventional way.

It should be noted that the layer 6 could have been doped in situ in the previous step shown in FIG. 5.

Figure 7:
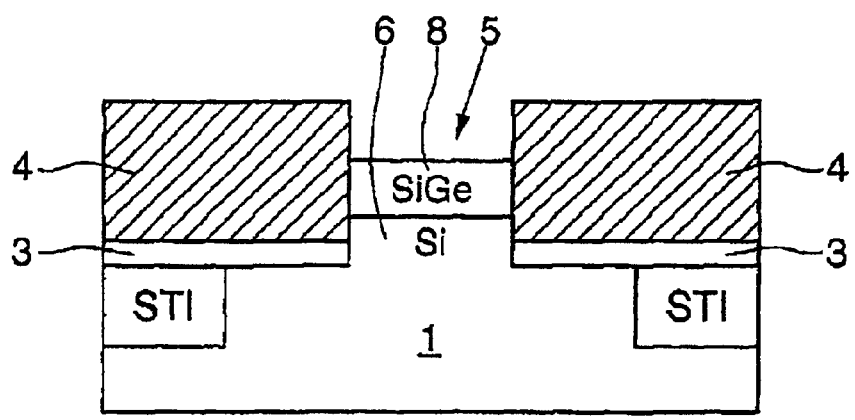

Then, as shown in FIG. 7, a second layer 8 of silicon-germanium alloy is formed in the window 5 on the first layer 6 by selective epitaxial growth. The percentage of germanium in the layer 8 can be from 15% to 40%. A small percentage of carbon can also be added, which does not compromise selective etching of the material with respect to silicon, but does provide improved lattice continuity between the silicon and the silicon-germanium alloy.

Figure 8:
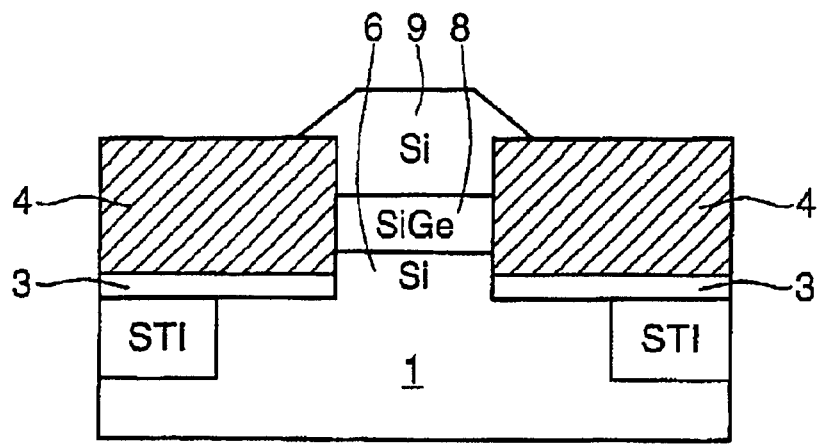

A third, overflowing silicon layer 9 is then formed by selective epitaxial growth on the silicon-germanium layer 8 (FIG. 8).

Figure 9:
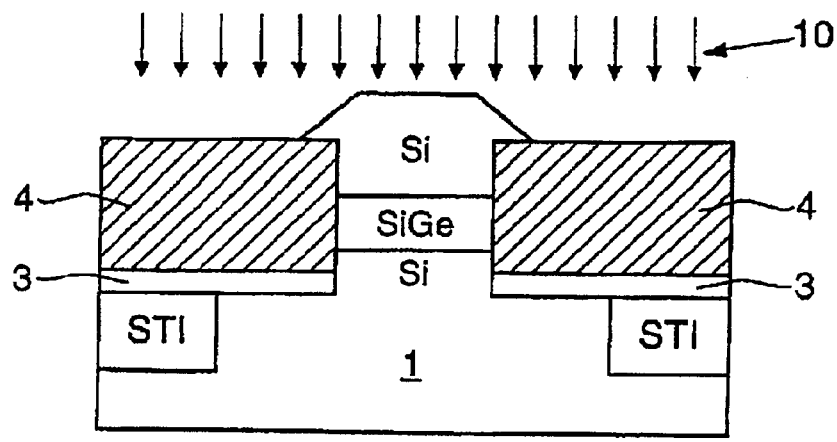

This is followed by implantation 10 (FIG. 9) of dopants with a high dose to dope the layer 9 and thereby form the drain region of the transistor. It should be noted here that diffusion of dopants from the drain toward the silicon-germanium layer 8 is not a problem because, as explained in more detail later, the silicon-germanium layer is subsequently removed.

Figure 10:
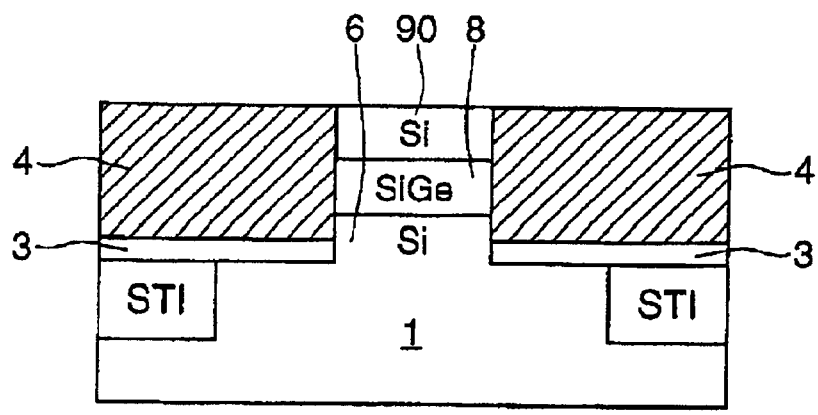

In FIG. 10, the top of the layer 9 has been flattened, for example by mechanical/chemical polishing. This flattening step is entirely optional, as the subsequent steps of the process can also accommodate a non-flattened pillar.

Figure 11:
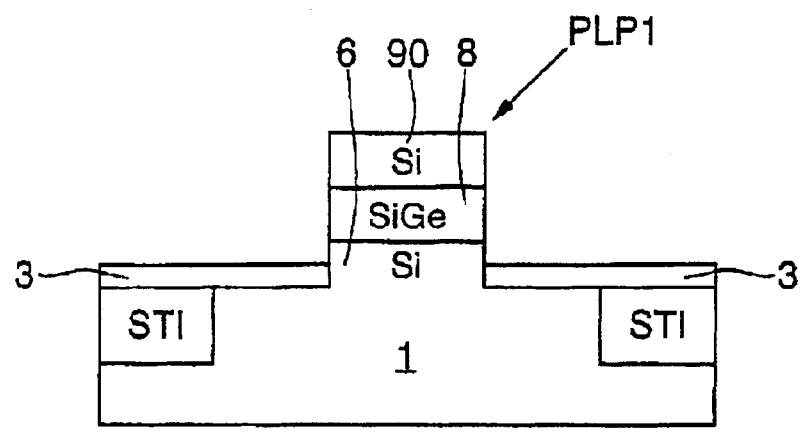

In the next step (FIG. 11), the silicon nitride layer of the dielectric block is removed, for example by conventional chemical attack. There is then obtained a stack PLP1 including the first layer 6, the second layer 8 and the flattened third layer 90.

Figure 12:
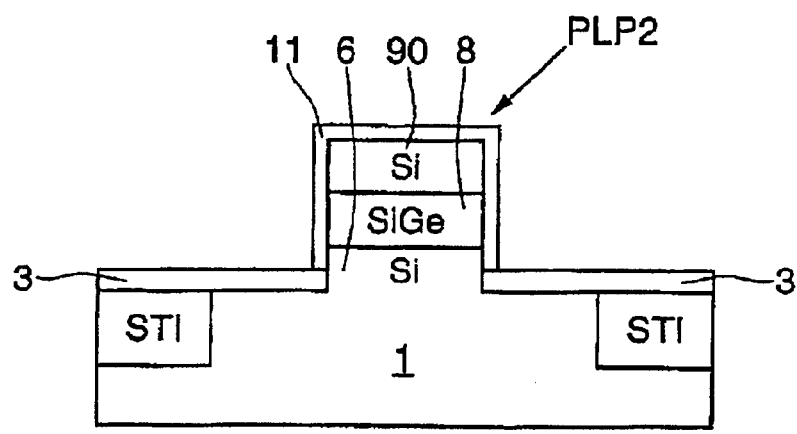
Figure 13:
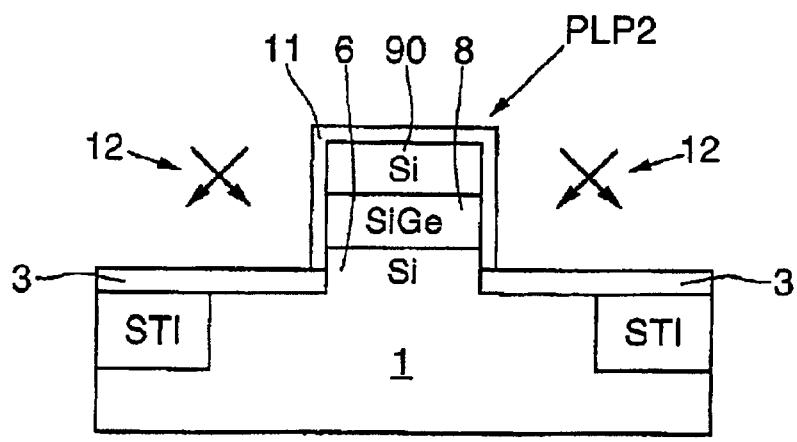

The process then continues (FIG. 12) with epitaxial growth of silicon that is selective with respect to the oxide layer 3. In other words, a surface silicon layer 11 is formed on the stack PLP1 by selective epitaxial growth, to obtain a primary pillar PLP2. It should be noted here that the thickness of the epitaxially grown layer 11 will define the thickness of the future connecting semiconductor regions within which the conduction channels of the future vertical transistor will be situated. Consequently, the person skilled in the art will notice that the thicknesses of the two channel regions of the transistor are not fixed by a photolithographic resolution but by a step of epitaxial growth, which enables very fine thicknesses to be obtained, typically of the order of a few tens of nanometers, for example 20 nanometers, or even less.

The channel of the future transistor, consisting of the flanks of the surface silicon layer 11, is then implanted 12 with a tilted implantation at a low dose and a high energy. In this regard, there is no fear of compensating the source and drain regions, whose dopant concentration is two orders of magnitude greater than that of the channel.

It should also be noted that the thickness of the pedestal oxide layer 3 is adjusted so that it is not entirely consumed by successive etching and interface cleaning operations. For example, a thickness of the order of 20 nanometers is chosen.

Figure 14:
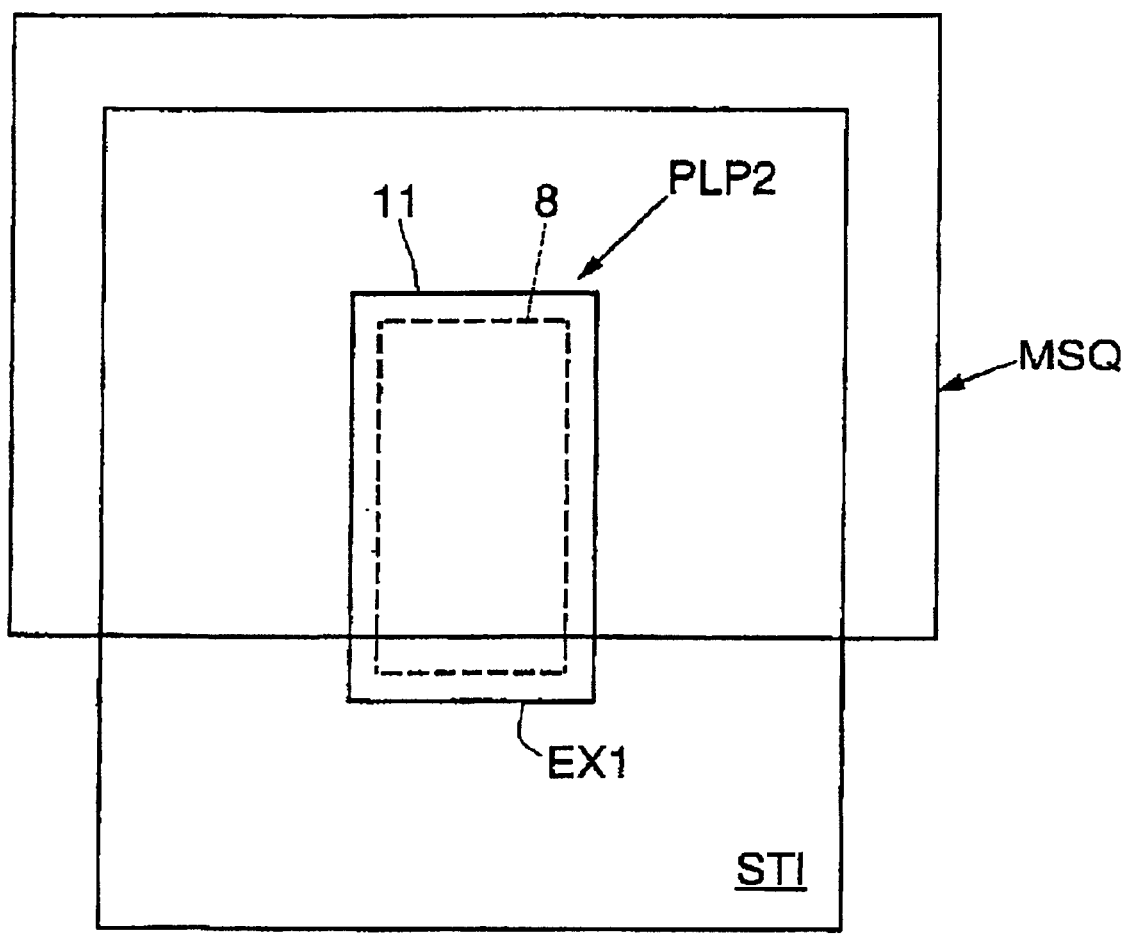

At this stage of the process, the primary pillar consists of a coating of silicon around a silicon-germanium core. The subsequent steps will consist of emptying out the core 8 of the pillar PLP2. In this regard, there is provision for opening the primary pillar PLP2 at one end to obtain access to the silicon-germanium layer (core) 8. This is possible, for example, using a mask MSQ to protect the pillar PLP2 over its length and exposing only one of its ends EX1 to etching (FIG. 14).

Figure 15:
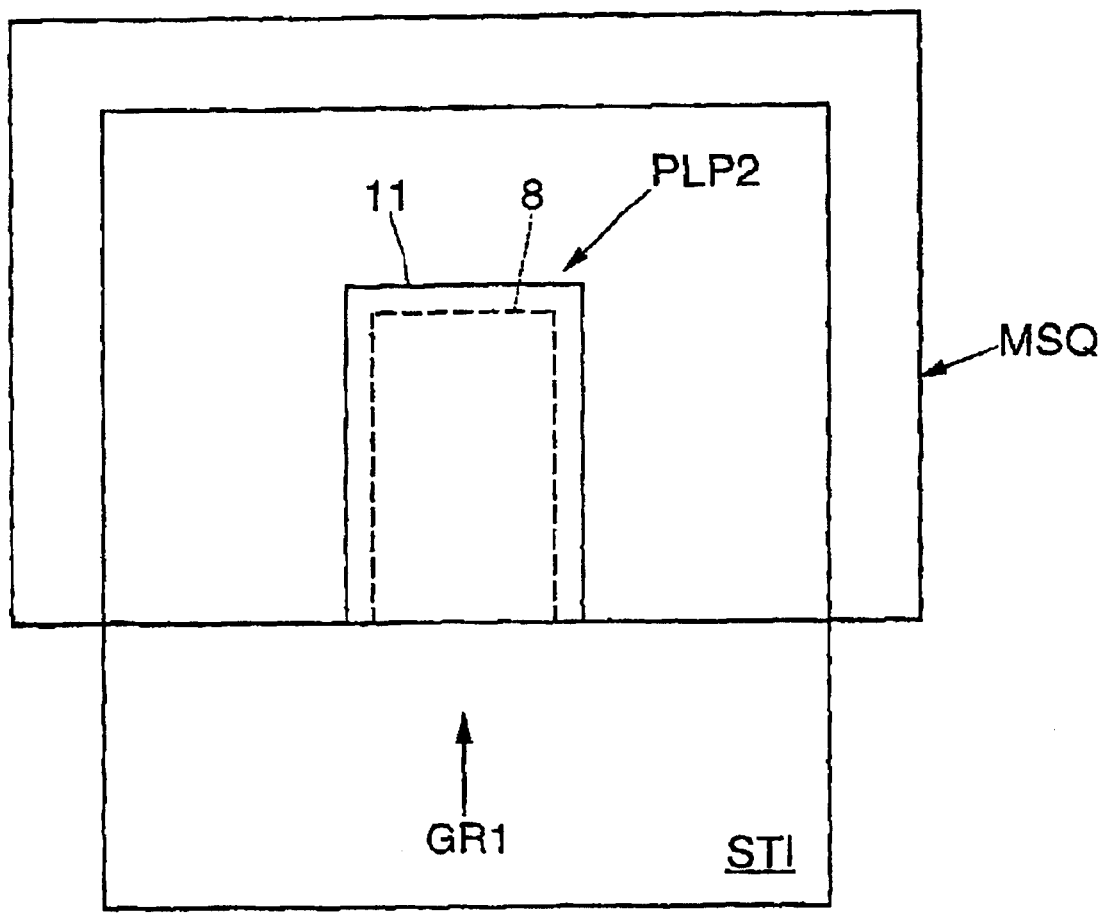

This is followed by selective etching GR1, as shown in FIG. 15. The etching is selective with respect to silicon and with respect to the silicon oxide 3.

This selective etching can be effected either by means of an oxidizing chemical process well known to the person skilled in the art (such as one using a solution containing 40 ml of 70% $HNO_3$+20 ml $H_2O_2$+5 ml of 0.5% HF), or by means of isotropic plasma etching.

Figure 16:
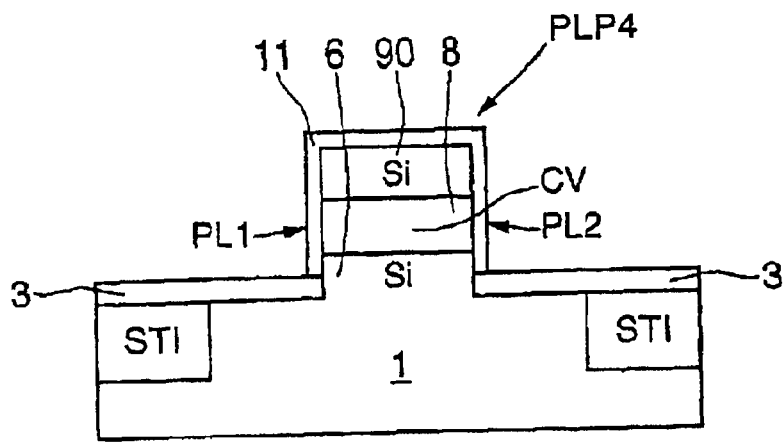

This produces a central cavity CV, as shown in the sectional view of FIG. 16. The pillar PLP4 obtained after this etching therefore has a top drain region 90, a bottom source region 6 and two very thin connecting semiconductor regions PL1 and PL2, in fact forming two ultrafine pillars.

Figure 17:
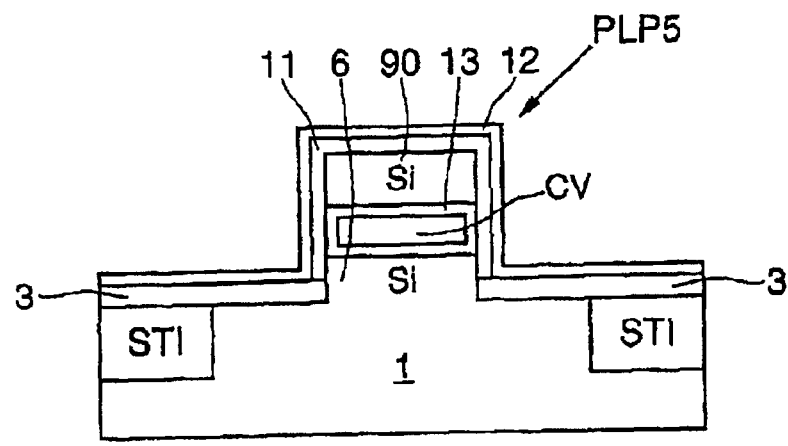
Figure 18:
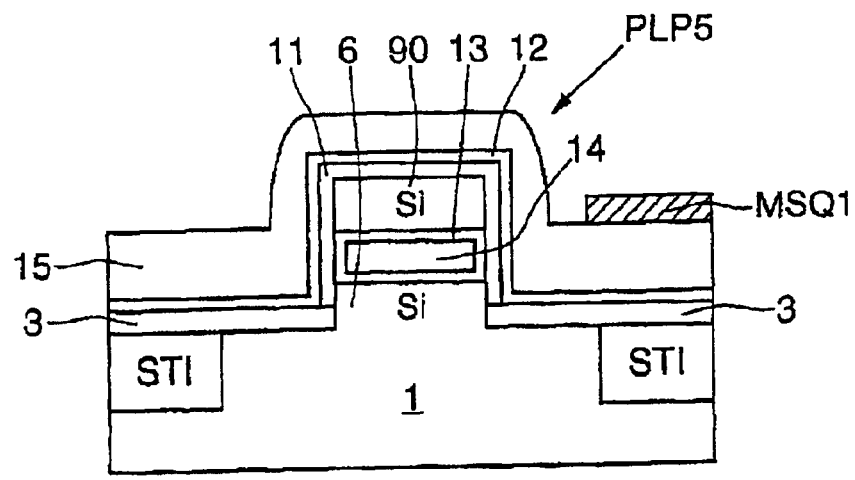
Figure 19:
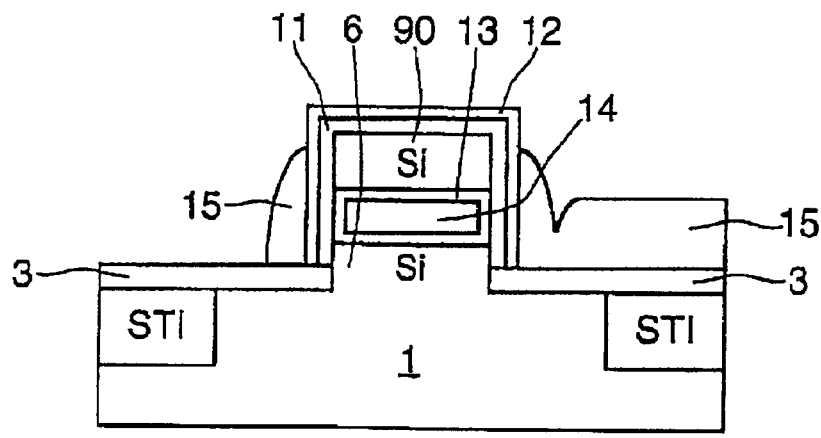

Then an external isolating layer 12 (for example of silicon dioxide) is then formed on the outside surface of the pillar PLP4 and on the pedestal oxide layer 3, together with an internal isolating layer 13 that coats the inside walls of the cavity CV, for example by thermal growth in a furnace (FIG. 17).

The next step consists in depositing a gate material layer 14 onto the pillar PLP5 from FIG. 17 in a conventional way that is well known to the person skilled in the art. This layer also fills the interior of the cavity CV. In this regard the gate can be doped in situ during its deposition.

Then, after placing a mask MSQ1 on the gate material on top of the lateral isolating region STI, for subsequent formation of a gate contact, the gate material is etched anisotropically to form the definitive gate region including an external part 15 resting through the intermediary of the oxide layers 12 and 3 on the external flanks of the pillar and an internal gate material layer 14 isolated from the source and drain regions and from the future channel regions by the internal isolating layer 13.

Figure 20:
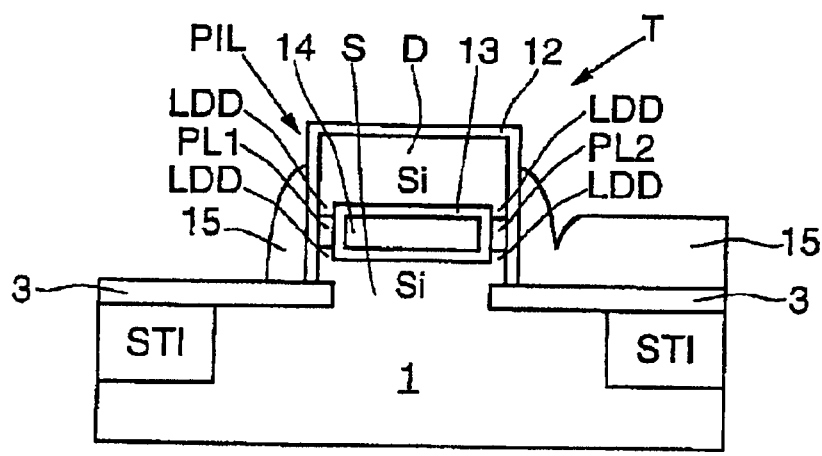

This is followed by annealing to activate the dopants of the source and drain regions and those of the gate (FIG. 20). Weakly doped source and drain extension areas LDD are formed by exodiffusion in each of the connecting semiconductor regions PL1 and PL2.

There is therefore no longer any deep junction problem.

Also, it should be noted that if a metal gate is used, the source and drain region dopants can be annealed earlier in the process, for example after the tilted implantation of the channels.

As shown in FIG. 20, the transistor according to the invention therefore includes, on a semiconductor substrate 1, a vertical pillar PIL incorporating a drain region D at the top. The transistor further includes a gate dielectric layer 12 situated on the flanks of the pillar and on the top surface of the substrate. The source region S is in the bottom part of the pillar and also in the substrate 1. The insulated gate has an isolated external portion 15 resting on the flanks of the pillar PL and an isolated internal gate material layer 14 situated inside the pillar, between the source and drain regions. Finally, the isolated internal gate material layer 14 is laterally separated from the isolated external portion 15 by two connecting semiconductor regions PL1 and PL2 extending between the source and drain regions.

Figure 21:
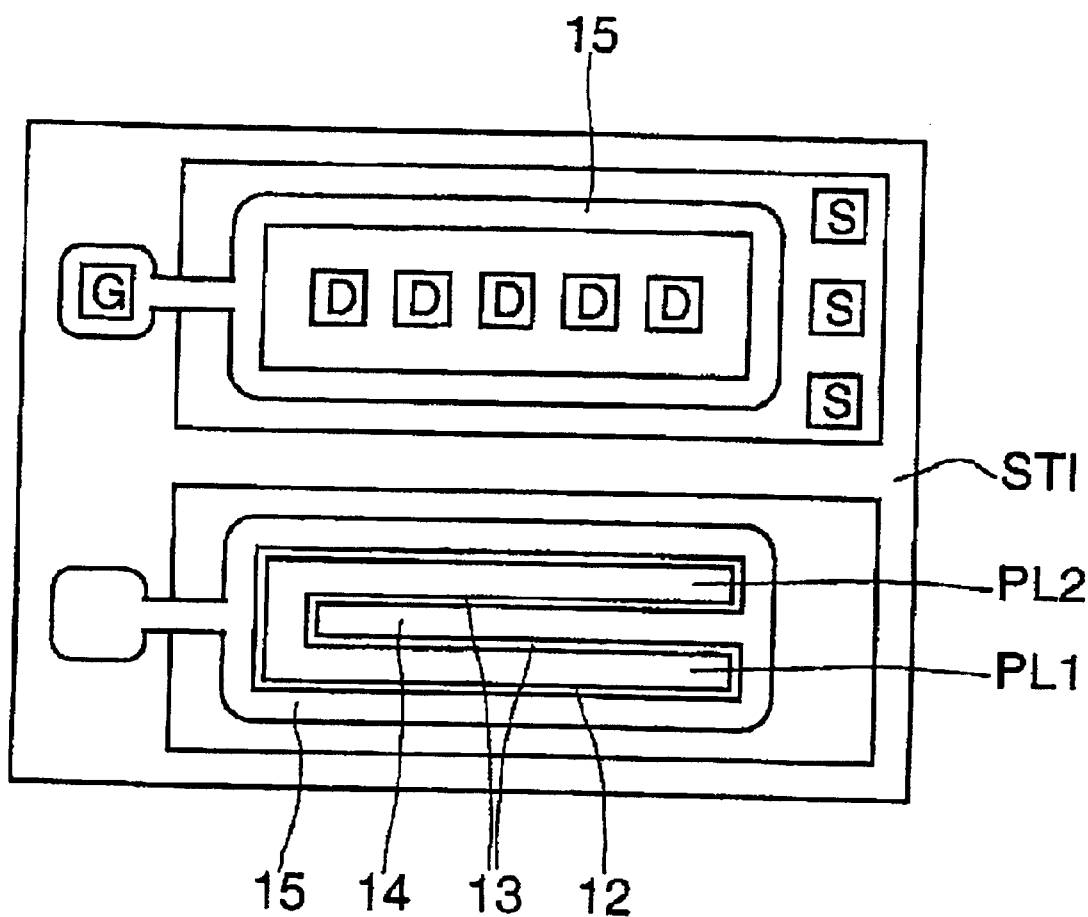

The top part of FIG. 21 is a plan view of the structure from FIG. 20, further showing the source, drain and gate contacts.

The bottom part of FIG. 21 is a section at the level of the isolated internal gate material layer 14 of the gate.

The transistor has four conduction channels functioning over the two connecting semiconductor regions PL1 and PL2. In each region PL1 or PL2, the two conduction channels are respectively situated along the external isolating layer 12 and along the internal isolating layer 13.

Furthermore, the use of very thin regions PL1 and PL2 also authorizes the integration of a single "mid-gap" gate, for example of metal or P+-doped germanium. In the case of a metal gate, the source and drain regions can easily be silicided. A "mid-gap" gate is formed of a material whose Fermi level coincides more or less with the intrinsic Fermi level of silicon.

This kind of transistor has considerable advantages. The entirely impoverished double gate mode of operation is obtained, which is the most favorable mode of operation for controlling the effects of short channels, thanks to the formation of very thin semiconductor regions PL1 and PL2.

Also, forming the two connecting semiconductor regions PL1 and PL2 in parallel quadruples the current $I_{on}$ rather than simply doubling it, as in the conventional vertical transistor configuration.

The invention also simultaneously produces very thin source and drain extension areas, by simple diffusion, and thereby significantly reduces the series resistances, because the source and the drain regions are still wide compared to the regions PL1 and PL2.

In this regard, the widening of the drain enables particularly easy contact, which would not have been the case if the whole of the pillar had been made thinner.

Finally, it should be noted that the present invention is entirely compatible with the process described in the French Patent Application Number 01/04436, filed on Apr. 2, 2001, and commonly assigned herewith to STMicroelectronics SA, entitled "A method of fabricating a vertical insulated gate transistor with low overlap of the gate on the source and the drain, and an integrated circuit including this kind of transistor" and is incorporated hereinto by reference in its entirety. To be more precise, the gate/source and gate/drain overlap capacitances can be significantly reduced by producing dielectric cavities in the spacers 15 of the external gate, those dielectric cavities respectively facing the source and drain regions. In this case, the external gate 15 has a first region resting on the gate dielectric layer 12 and a second region facing the source and drain regions and separated from those regions by dielectric cavities. The first region is formed of a silicon-germanium alloy and the second region is formed of silicon, for example.

From a fabrication process point of view, and with regard to the formation of the external insulated gate region, this kind of embodiment includes the deposition on the layer 12 of a semiconductor stack including, for example, a silicon-germanium alloy on top of which is silicon, for example, followed by anisotropic etching to form the gate spacers resting on the flanks of the pillar, and finally partial selective etching of the silicon-germanium with respect to the silicon to form the cavities.

The cavities are then filled with a dielectric material, for example silicon dioxide, by oxidation or deposition.

Although a specific embodiment of the invention has been disclosed, it will be understood by those having skill in the art that changes can be made to this specific embodiment without departing from the spirit and scope of the invention. The invention is not limited to the embodiments that have just been described, but embraces all variants thereof. Accordingly, although there is described here the formation of the primary pillar stack by selective epitaxial growth in a window in a dielectric block, the pillar could be formed by etching a stack grown epitaxially on the substrate. The scope of the invention is not to be restricted, therefore, to the specific embodiment, and it is intended that the appended claims cover any and all such applications, modifications, and embodiments within the scope of the present invention.

What is claimed is:

1. A method of fabricating a vertical insulated gate transistor, the method comprising:
    forming a vertical semiconductor pillar with one or more flanks on a semiconductor substrate; and
    forming a dielectrically isolated semiconductor gate with a cavity, so that the gate is resting on the flanks of the pillar and on the substrate;
    wherein the step of forming the vertical semiconductor pillar includes forming a primary semiconductor pillar resting on the substrate and forming the cavity in the primary pillar; and
    wherein the step of forming the gate further includes coating one or more internal walls of the cavity with an isolating layer and filling the cavity with a gate material so as to form between a portion of the gate situated in the cavity and a portion of the gate resting on the flanks of the pillar, and to form two connecting semiconductor regions extending between a source region and a drain region of the transistor.

2. The method according to claim 1, wherein the forming of the primary semiconductor pillar further includes:
    forming a stack including a first layer of a first semiconductor material, a second layer of a second semiconductor material that can be selectively eliminated with respect to the first material, and a third layer of the first semiconductor material;
    forming on the stack a surface semiconductor layer of the first material; and
    selectively etching in the second layer of the stack to form the cavity.

3. The method according to claim 2, wherein the forming a stack includes forming the stack by selective epitaxial growth inside a window formed in a dielectric block resting on the substrate, the window opening onto the substrate; and
    wherein the forming the surface semiconductor layer includes removing the dielectric block and selective growing epitaxially the surface semiconductor layer on the stack.

4. The method according to claim 3, wherein the forming the stack is with a first material which is silicon and a second material which is an alloy of silicon and germanium.

5. The method according to claim 4, wherein the forming the stack is with a first material which is silicon and a second material which is an alloy of silicon and germanium.

6. The method according to claim 2, wherein the forming of the primary pillar includes epitaxial growing the three layers on the substrate followed by anisotropic etching of the epitaxially grown layers and wherein the forming of the surface semiconductor layer includes selective growing epitaxially the semiconductor surface layer on the stack.

7. The method according to claim 6, wherein the forming the stack is with a first material which is silicon and a second material which is an alloy of silicon and germanium.

8. A method of fabricating a vertical insulated gate transistor, the method comprising:
    forming a vertical semiconductor pillar with one or more flanks on a semiconductor substrate;
    forming a dielectrically isolated semiconductor gate with a cavity, so that the gate is resting on the flanks of the pillar and on the substrate;
    wherein the step of forming the vertical semiconductor pillar includes forming a primary semiconductor pillar resting on the substrate and forming the cavity in the primary pillar
    wherein the forming of the primary semiconductor pillar further includes:
        forming a stack including a first layer of a first semiconductor material, a second layer of a second semiconductor material that can be selectively eliminated with respect to the first material, and a third layer of the first semiconductor material;
        forming on the stack a surface semiconductor layer of the first material; and
        selectively etching in the second layer of the stack to form the cavity;
    wherein the step of forming the gate further includes coating one or more internal walls of the cavity with an isolating layer and filling the cavity with a gate material so as to form between a portion of the gate situated in the cavity and a portion of the gate resting on the flanks of the pillar, and to form two connecting semiconductor regions extending between a source region and a drain region of the transistor.

9. The method according to claim 8, wherein the forming a stack includes forming the stack by selective epitaxial growth inside a window formed in a dielectric block resting on the substrate, the window opening onto the substrate; and wherein the forming the surface semiconductor layer includes removing the dielectric block and selective growing epitaxially the surface semiconductor layer on the stack.

10. The method according to claim 9, wherein the forming the stack is with a first material which is silicon and a second material which is an alloy of silicon and germanium.

11. The method according to claim 9, wherein the forming the gate further includes:

forming an external isolating layer on the primary pillar and an internal isolating layer on the one or more internal walls of the cavity;

depositing the gate material on the external isolating layer and in the cavity of the internal isolating layer, and anisotropically etching the gate material.

12. The method according to claim 9, wherein the forming the surface semiconductor layer includes forming the surface semiconductor layer with a thickness of less than 70 nanometers.

13. The method according to claim 9, further comprising:

annealing to activate dopants of the source region and the drain region leading by exodiffusion to the formation of source and drain extension areas in a portion of the semiconductor connecting regions.

14. The method according to claim 8, wherein the forming of the primary pillar includes epitaxial growing the three layers on the substrate followed by anisotropic etching of the epitaxially grown layers and wherein the forming of the surface semiconductor layer includes selective growing epitaxially the semiconductor surface layer on the stack.

15. The method according to claim 14, wherein the forming the stack is with a first material which is silicon and a second material which is an alloy of silicon and germanium.

16. The method according to claim 15, further comprising:

annealing to activate dopants of the source region and the drain region leading by exodiffusion to the formation of source and drain extension areas in a portion of the semiconductor connecting regions.

17. The method according to claim 15, further comprising:

annealing to activate dopants of the source region and the drain region leading by exodiffusion to the formation of source and drain extension areas in a portion of the semiconductor connecting regions.

18. The method according to claim 14, wherein the forming the gate further includes:

forming an external isolating layer on the primary pillar and an internal isolating layer on the one or more internal walls of the cavity;

depositing the gate material on the external isolating layer and in the cavity of the internal isolating layer; and anisotropically etching the gate material.

19. The method according to claim 15, wherein the forming the gate further includes:

forming an external isolating layer on the primary pillar and an internal isolating layer on the one or more internal walls of the cavity;

depositing the gate material on the external isolating layer and in the cavity of the internal isolating layer; and anisotropically etching the gate material.

20. The method according to claim 19, wherein the forming the surface semiconductor layer includes forming the surface semiconductor layer with a thickness of less than 70 nanometers.

21. The method according to claim 20, further comprising:

annealing to activate dopants of the source region and the drain region leading by exodiffusion to the formation of source and drain extension areas in a portion of the semiconductor connecting regions.

22. The method according to claim 15, wherein the forming the surface semiconductor layer includes forming the surface semiconductor layer with a thickness of less than 70 nanometers.

23. The method according to claim 14, wherein the forming the surface semiconductor layer includes forming the surface semiconductor layer with a thickness of less than 70 nanometers.

24. The method according to claim 14, further comprising:

annealing to activate dopants of the source region and the drain region leading by exodiffusion to the formation of source and drain extension areas in a portion of the semiconductor connecting regions.

25. The method according to claim 8, wherein the forming the stack is with a first material which is silicon and a second material which is an alloy of silicon and germanium.

26. The method according to claim 8, wherein the forming the gate further includes:

forming an external isolating layer on the primary pillar and an internal isolating layer on the one or more internal walls of the cavity;

depositing the gate material on the external isolating layer and in the cavity of the internal isolating layer; and anisotropically etching the gate material.

27. The method according to claim 8, wherein the forming the surface semiconductor layer includes forming the surface semiconductor layer with a thickness of less than 70 nanometers.

28. The method according to claim 8, further comprising:

annealing to activate dopants of the source region and the drain region leading by exodiffusion to the formation of source and drain extension areas in a portion of the semiconductor connecting regions.

29. The method according to claim 8, further comprising:

annealing to activate dopants of the source region and the drain region leading by exodiffusion to the formation of source and drain extension areas in a portion of the semiconductor connecting regions.

* * * * *